United States Patent
Hamparian

(10) Patent No.: US 10,263,572 B2
(45) Date of Patent: Apr. 16, 2019

(54) RADIO FREQUENCY APPARATUS AND METHOD WITH DUAL VARIABLE IMPEDANCE COMPONENTS

(71) Applicant: Futurewei Technologies, Inc., Plano, TX (US)

(72) Inventor: Simon Hamparian, Emerson, NJ (US)

(73) Assignee: Futurewei Technologies, Inc., Plano, TX (US)

(*) Notice: Subject to any disclaimer, the term of this patent is extended or adjusted under 35 U.S.C. 154(b) by 0 days.

(21) Appl. No.: 15/286,481

(22) Filed: Oct. 5, 2016

(65) Prior Publication Data

US 2018/0097480 A1 Apr. 5, 2018

(51) Int. Cl.
| | | |
|---|---|---|
| H04B 1/04 | (2006.01) | |
| H03F 1/56 | (2006.01) | |
| H03F 3/19 | (2006.01) | |
| H03F 3/24 | (2006.01) | |
| H03F 3/68 | (2006.01) | |
| H04B 7/06 | (2006.01) | |

(52) U.S. Cl.
CPC ........... *H03F 1/56* (2013.01); *H03F 3/19* (2013.01); *H03F 3/245* (2013.01); *H03F 3/68* (2013.01); *H04B 1/0458* (2013.01); *H04B 1/0475* (2013.01); *H03F 2200/378* (2013.01); *H03F 2200/387* (2013.01); *H03F 2200/451* (2013.01); *H04B 7/0617* (2013.01); *H04B 2001/0408* (2013.01)

(58) Field of Classification Search
CPC ........ H03F 2200/318; H03F 3/21; H03F 1/52; H03F 1/56; H03F 3/19; H03F 3/245; H04B 1/0064; H04B 1/0475; H04B 1/0458

USPC .................................................. 375/295–299
See application file for complete search history.

(56) References Cited

U.S. PATENT DOCUMENTS

| | | | | |
|---|---|---|---|---|
| 8,130,054 B1* | 3/2012 | Martin | ...................... | H01P 1/36 333/1.1 |
| 8,744,384 B2* | 6/2014 | Mendolia | .................. | H01P 5/04 455/129 |
| 9,000,847 B2* | 4/2015 | Zhao | ......................... | H03F 1/42 330/302 |
| 9,166,561 B1* | 10/2015 | Furino, Jr. | ........... | H04B 1/1036 |
| 9,485,009 B1* | 11/2016 | Shemesh | ............ | H04B 7/18508 |
| 9,819,327 B2* | 11/2017 | Maruthamuthu | .... | H03H 9/0014 |

(Continued)

FOREIGN PATENT DOCUMENTS

| | | |
|---|---|---|
| WO | 03065574 A2 | 8/2003 |
| WO | 2011097366 A2 | 8/2011 |
| WO | 2012027703 A2 | 3/2012 |

OTHER PUBLICATIONS

Allen, W. N. et al., "Three-Bit and Six-Bit Tunable Matching Networks with Tapered Lines," IEEE, 2009, pp. 1-4.

(Continued)

*Primary Examiner* — Emmanuel Bayard
(74) *Attorney, Agent, or Firm* — Slater Matsil, LLP

(57) ABSTRACT

A radio frequency (RF) transmitter apparatus and method are provided with dual variable impedance components. Included is at least one RF transmitter with a power amplifier and a filter. Further, a first variable impedance component is in electrical communication between the filter and an antenna port. Also included is a second variable impedance component in electrical communication between the power amplifier and the filter.

26 Claims, 10 Drawing Sheets

(56) References Cited

U.S. PATENT DOCUMENTS

| | | | | |
|---|---|---|---|---|
| 9,866,266 | B2* | 1/2018 | Ella | H04B 1/48 |
| 2002/0101907 | A1* | 8/2002 | Dent | H03F 3/24 |
| | | | | 375/132 |
| 2003/0215373 | A1* | 11/2003 | Reyzelman | H01J 37/32082 |
| | | | | 422/186.29 |
| 2004/0224649 | A1* | 11/2004 | Shamsaifar | H03F 3/1935 |
| | | | | 455/107 |
| 2007/0149146 | A1* | 6/2007 | Hwang | H01Q 1/242 |
| | | | | 455/80 |
| 2007/0197180 | A1* | 8/2007 | McKinzie, III | H03H 7/40 |
| | | | | 455/248.1 |
| 2008/0136548 | A1* | 6/2008 | Park | H03H 7/40 |
| | | | | 333/17.3 |
| 2010/0321110 | A1* | 12/2010 | Ichitsubo | H03F 3/195 |
| | | | | 330/144 |
| 2011/0210787 | A1* | 9/2011 | Lee | H03F 1/56 |
| | | | | 330/126 |
| 2011/0248572 | A1* | 10/2011 | Kozakai | H03F 1/565 |
| | | | | 307/104 |
| 2011/0254637 | A1* | 10/2011 | Manssen | H03H 7/40 |
| | | | | 333/2 |
| 2011/0269416 | A1* | 11/2011 | Kadoi | H04B 1/0458 |
| | | | | 455/127.2 |
| 2011/0285475 | A1* | 11/2011 | Lu | H04B 1/48 |
| | | | | 333/104 |
| 2012/0007666 | A1* | 1/2012 | David | H03H 9/02031 |
| | | | | 327/552 |
| 2012/0026063 | A1* | 2/2012 | Lee | H03H 7/40 |
| | | | | 343/860 |
| 2012/0057588 | A1* | 3/2012 | Duzdar | H01P 1/213 |
| | | | | 370/339 |
| 2012/0075019 | A1* | 3/2012 | Visser | H03F 1/565 |
| | | | | 330/196 |
| 2012/0229330 | A1* | 9/2012 | Grebennikov | G01S 7/034 |
| | | | | 342/175 |
| 2013/0120217 | A1* | 5/2013 | Ueda | H01P 1/203 |
| | | | | 343/860 |
| 2013/0278333 | A1* | 10/2013 | Corral | H03F 3/602 |
| | | | | 330/144 |
| 2014/0253259 | A1 | 9/2014 | Holland | |
| 2014/0266531 | A1* | 9/2014 | Leipold | H03F 3/195 |
| | | | | 336/170 |
| 2014/0327594 | A1* | 11/2014 | Zhang | H03H 7/40 |
| | | | | 343/861 |
| 2014/0354350 | A1* | 12/2014 | Bowers | H03F 3/195 |
| | | | | 327/564 |
| 2014/0354374 | A1* | 12/2014 | Kawachi | H03H 9/02535 |
| | | | | 333/133 |
| 2014/0378188 | A1* | 12/2014 | Liu | H04W 52/0261 |
| | | | | 455/574 |
| 2015/0015339 | A1* | 1/2015 | Gorbachov | H03G 3/3042 |
| | | | | 330/291 |
| 2015/0091776 | A1* | 4/2015 | Gaynor | H03K 17/693 |
| | | | | 343/860 |
| 2015/0200646 | A1* | 7/2015 | Peng | H03H 7/40 |
| | | | | 455/77 |
| 2015/0349731 | A1* | 12/2015 | Kwon | H03F 1/565 |
| | | | | 330/252 |
| 2016/0173030 | A1* | 6/2016 | Langer | H03F 1/0222 |
| | | | | 330/291 |
| 2016/0211813 | A1* | 7/2016 | Gonzalez Jimenez | H03H 7/40 |
| 2017/0077983 | A1* | 3/2017 | Ella | H03H 7/465 |
| 2017/0346516 | A1* | 11/2017 | Ripley | H04B 1/1036 |

OTHER PUBLICATIONS

Yoon, Y. et al., "A Dual-Mode CMOS RF Power Amplifier With Integrated Tunable Matching Network," IEEE Transactions on Microwave Theory and Techniques, vol. 60, No. 1, Jan. 2012, pp. 77-88.

Atilla, D. C. et al., "A Tunable Inductance Topology to Realize Frequency Tunable Matching Networks and Amplifiers," IEEE, 2013, pp. 77-80.

Chen, Y. et al., "A Varactor-Based Tunable Matching Network for a Non-Resonant Mobile Terminal Antenna," The 8th European Conference on Antennas and Propagation, 2014, pp. 1877-1881.

Whatley, R. et al., "CMOS Based Tunable Matching Networks for Cellular Handset Applications," IEEE, 2011, pp. 1-4.

Fu, J.-S. et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.

Mankaruse, G. et al., "Practical Approach—Tunable Antennas and Tunable Matching Networks," IEEE, 2015, pp. 2383-2384.

* cited by examiner

RADIO FREQUENCY APPARATUS AND METHOD WITH DUAL VARIABLE IMPEDANCE COMPONENTS

FIELD OF THE INVENTION

The present invention relates to radio frequency (RF) systems, and more particularly to RF transmitters.

BACKGROUND

In multiple-input-multiple-output (MIMO) systems, there is an antenna-to-antenna coupling which causes an antenna voltage standing wave ratio (VSWR) to degrade significantly (e.g. 2.5:1, worst case). Use of techniques such as beam steering in such MIMO systems can also degrade the antenna VSWR. Still yet, bandpass filters [e.g. film bulk acoustic resonator (FBAR) filters, etc.] are typically placed before each antenna, and these filters have VSWRs in the order of 2:1 (worst case). Thus, the cascaded VSWR of the aforementioned filter and antenna can be as bad as 5:1 in some cases for all angles (i.e. all antenna beaming angles between zero (0) and three-hundred and sixty (360) degrees, etc.).

In the past, isolators have been inserted between a power amplifier and the aforementioned filter/antenna, in order to protect the amplifier from failing due to a detrimental VSWR. Unfortunately, isolators are expensive and take up a lot of area. In addition, isolators are generally not amenable to integration (on an integrated circuit). Event still, when employing isolators, approximately half of a transmit power may be lost due to a mismatch between an isolator output and the aforementioned 5:1 cascaded VSWR at the filter input.

SUMMARY

A radio frequency (RF) transmitter apparatus and method are provided with dual variable impedance components. Included is at least one RF transmitter with a power amplifier and a filter. Further, a first variable impedance component is in electrical communication between the filter and an antenna port. Also included is a second variable impedance component in electrical communication between the power amplifier and the filter.

In a first embodiment, the filter may include a bandpass filter. As an option, the filter may include a film bulk acoustic resonator (FBAR) filter.

In a second embodiment (which may or may not be combined with the first embodiment), the first variable impedance component and/or the second variable impedance component may include a tunable matching network. In one embodiment, the tunable matching network may include a micro strip line element and a pair of variable capacitive components (e.g. capacitors, etc.). In operation, the tunable matching network may be configured for exhibiting different impedances, for each of a plurality of antenna beaming angles between zero (0) and three-hundred and sixty (360) degrees.

In a third embodiment (which may or may not be combined with the first and/or second embodiments), the at least one RF transmitter may include a plurality of RF transmitters that are part of a multiple-input-multiple-output (MIMO)-capable system.

In a fourth embodiment (which may or may not be combined with the first, second, and/or third embodiments), the first variable impedance component and the second variable impedance component may be configured to cooperate to compensate for a voltage standing wave ratio (VSWR) of up to five-to-one (5:1). Further, this may be accomplished for each of a plurality of antenna beaming angles between zero (0) and three-hundred and sixty (360) degrees.

In a fifth embodiment (which may or may not be combined with the first, second, third, and/or fourth embodiments), the first variable impedance component and the second variable impedance component may be configured to cooperate to compensate for a delay of the filter of up to thirty (30) nanoseconds. Further, this may be accomplished for each of a plurality of antenna beaming angles between zero (0) and three-hundred and sixty (360) degrees.

In a sixth embodiment (which may or may not be combined with the first, second, third, fourth, and/or fifth embodiments), the at least one RF transmitter may further include an additional component [e.g. digital pre-distortion (DPD) component, etc.] in electrical communication between the first variable impedance component and the filter, for measuring a forward power and a reflected power. As an option, the first variable impedance component and/or the second variable impedance component may be configured for exhibiting variable impedance, based on the measured forward power and the reflected power.

In a seventh embodiment (which may or may not be combined with the first, second, third, fourth, fifth, and/or sixth embodiments), the apparatus may be configured for measuring a first return loss at an output of the filter, and controlling a first variable impedance of the first variable impedance component, based on the first return loss. Still yet, optionally after the aforementioned measuring and controlling, the apparatus may be configured for measuring a second return loss at an input of the filter, and controlling a second variable impedance of the second variable impedance component, based on the second return loss. As a further option, the apparatus may be configured for repeating each of the measuring and the controlling for each of a plurality of antenna beaming angles between zero (0) and three-hundred and sixty (360) degrees.

To this end, in some optional embodiments, one or more of the foregoing features of the aforementioned apparatus and method may provide a transmitter design that is less expensive, requires less area, and/or is amenable to integration (on an integrated circuit). In addition, various embodiments may prevent up to half of a transmit power from being lost due to a cascaded 5:1 VSWR at an input of the transmit filter/antenna [at all angles between zero (0) and three-hundred and sixty (360) degrees]. These potential advantages would otherwise be foregone in systems that employ isolators or other types of prior art designs. It should be noted that the aforementioned potential advantages are set forth for illustrative purposes only and should not be construed as limiting in any manner.

DETAILED DESCRIPTION

Figure 1:
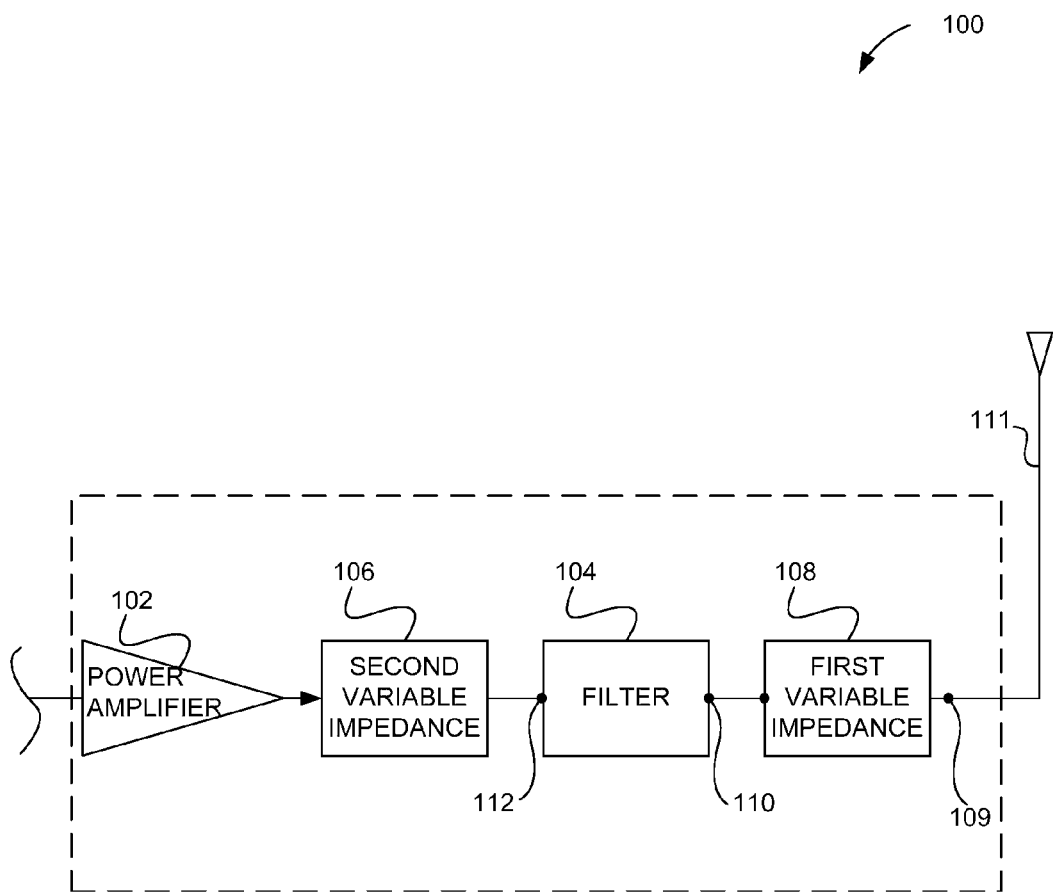
FIG. 1 illustrates a radio frequency (RF) transmitter equipped with dual variable impedance components, in accordance with one embodiment.

FIG. 1 illustrates a radio frequency (RF) transmitter 100 equipped with dual variable impedance components, in accordance with one embodiment. In the context of the present description, a variable impedance component may include any element, circuit, network and/or any other component that is capable of exhibiting a varying impedance. For example, in one possible embodiment, the variable impedance component may include a tunable matching network that includes any combination of networked components (e.g. a network, etc.) with a digitally-tunable impedance.

With reference to FIG. 1, the RF transmitter 100 is shown to include a power amplifier 102 and a filter 104. In various embodiments, the filter 104 may include a bandpass filter [e.g. a film bulk acoustic resonator (FBAR) filter, etc.] and/or absolutely any other type of filter that is capable of filtering a signal (i.e. removing at least one feature, characteristic, part, etc. thereof).

Further included is a first variable impedance component 108 that is in electrical communication between the filter 104 and an antenna port 109. Also provided is a second variable impedance component 106 in electrical communication between the power amplifier 102 and the filter 104. Such variable impedance components 106, 108 may include any component configured for exhibiting variable impedance (e.g. resistance, capacitance, and/or inductance, etc.). Further, by positioning the two variable impedance components 106, 108 on both sides of the filter 104, as shown, the two variable impedance components 106, 108 together ensure that an overall voltage standing wave ratio (VSWR) of a cascaded transmit path of the RF transmitter 100 may be matched to a predetermined amount so that less (and possibly no) transmitted power is lost.

Specifically, in use, the filter 104 may exhibit a very steep roll off outside a transmit band, particularly when implemented as a bandpass filter in the form of a FBAR filter. When implemented in such form, a VSWR can be 2:1 (in a worst case, resulting in a return loss of −9.5 dB) in band. In addition, when multiple RF transmitters 100 are used in a communication system, a cross coupling between antennas can produce an antenna VSWR of 2.5:1 (i.e. return loss of −7.4 dB in a worst case). Thus, a worst case cascaded VSWR of each filter/antenna may be as high as 5:1 (i.e. resulting in a return loss of −3.5 dB). If an isolator were to be used at an output of the power amplifier 102, 2.6 dB of the transmitted power would be lost due to a mismatch at each isolator output; and a cascaded return loss of 3.5 dB would be presented at the corresponding filter. However, by employing the two variable impedance components 106, 108 (as opposed to an isolator), less (if any) transmitted power is lost due to an impedance mismatch in connection with each filter/antenna, since the two variable impedance components 106, 108 compensate for such mismatch.

In the context of the present description, "electrical communication" may refer to any direct (i.e. no component(s) therebetween, etc.) and/or indirect electrical communication where one or more components are connected therebetween for processing or otherwise affecting a signal transmitted therebetween. Still yet, the antenna port 109 may refer to any conductive element (on- or off-chip) to which an antenna 111 may be attached, for communicating a signal to the antenna 111 for radiating an RF signal therefrom.

Specifically, in accordance with one possible embodiment, an output of the power amplifier 102 is in electrical communication with an input of the second variable impedance component 106, and an output of the second variable impedance component 106 is in electrical communication with an input 112 of the filter 104. Further, an output 110 of the filter 104 is in electrical communication with an input of the first variable impedance component 108 whose output is in electrical communication with the antenna port 109 and the antenna 111 (to the extent one has been included/installed).

In use in accordance with one possible embodiment, the first variable impedance component 108 and the second variable impedance component 106 may cooperate to compensate for a VSWR of up to five-to-one (5:1). Further, in the context of an embodiment where beam steering (or other desired technique for controlling transmission via the antenna 111), this may be accomplished for each of a plurality of antenna beaming angles between zero (0) and three-hundred and sixty (360) degrees. As mentioned earlier, the two variable impedance components 106, 108 compensate for any impedance mismatch, thus resulting in less (if any) transmitted power being lost due to an impedance mismatch in connection with the filter/antenna. In the case of more complex communication systems where beam steering, etc. is employed, such variable impedance components 106, 108 may be dynamically adjusted to accommodate for any fluctuation in impedance mismatch resulting from changing operation of the RF transmitter 100. More information regarding the manner in which such adjustment may possibly occur will be set forth later during the description of subsequent embodiments.

Still yet, in another optional embodiment, the first variable impedance component 108 and the second variable impedance component 106 may cooperate to compensate for a delay of the filter 104 of up to thirty (30) nanoseconds. Further, this may be accomplished for each of a plurality of antenna beaming angles between zero (0) and three-hundred and sixty (360) degrees. In particular, use of FBAR-type filters to implement the filter 104 may result in a group delay that is considerably large. As is known, a group delay is an average time delay of a composite signal suffered at each frequency component. Thus, when certain types of filters are used, a transmitted signal may be delayed by such group delay before reaching the antenna 111. Further, any reflected signal from the antenna 111 would also be delayed again by the filter 104. Thus, a total signal delay would become double the group delay of the filter 104. For example, with a filter group delay of 15 ns, the total signal delay can be 30 ns, which translates into 33 MHz in frequency. Many frequency bands currently in use have bandwidths exceeding 33 MHz, which means that, at every 33 MHz in the transmit band, there would be a spike in the VSWR looking into the filter 104. Thus, similar to the aforementioned compensation of the VSWR, the two variable impedance components 106, 108 may be used to compensate for spikes in VSWRs caused by a delay in the filter 104. More information regarding the manner in which such adjustment may possibly occur will be set forth later during the description of subsequent embodiments.

To this end, in some optional embodiments, one or more of the foregoing features may provide a transmitter design that is less expensive, requires less area, and/or is amenable to integration (on an integrated circuit). In addition, various embodiments may prevent up to half of a transmit power from being lost due to a cascaded 5:1 (or other detrimental value) VSWR at an input of the transmit filter/antenna. These potential advantages would otherwise be foregone in systems that employ isolators or other types of prior art designs. For example, by utilizing two variable impedance components 106, 108 on both sides of the filter 104 (as opposed to just one side) an overall VSWR of a cascaded transmit path may be matched to a predetermined amount so that less (and possibly no) transmitted power is lost (even for bad antenna and filter VSWRs), thereby obviating a need for the aforementioned isolator. It should be noted that the aforementioned potential advantages are set forth for illustrative purposes only and should not be construed as limiting in any manner.

More illustrative information will now be set forth regarding various optional architectures and uses in which the foregoing method may or may not be implemented, per the desires of the user. For example, the aforementioned RF transmitter 100 may be one of a plurality of RF transmitters that are part of a multiple-input-multiple-output (MIMO)-capable system. It should be noted that the following information is set forth for illustrative purposes and should not be construed as limiting in any manner. Any of the following features may be optionally incorporated with or without the exclusion of other features described.

Figure 2:
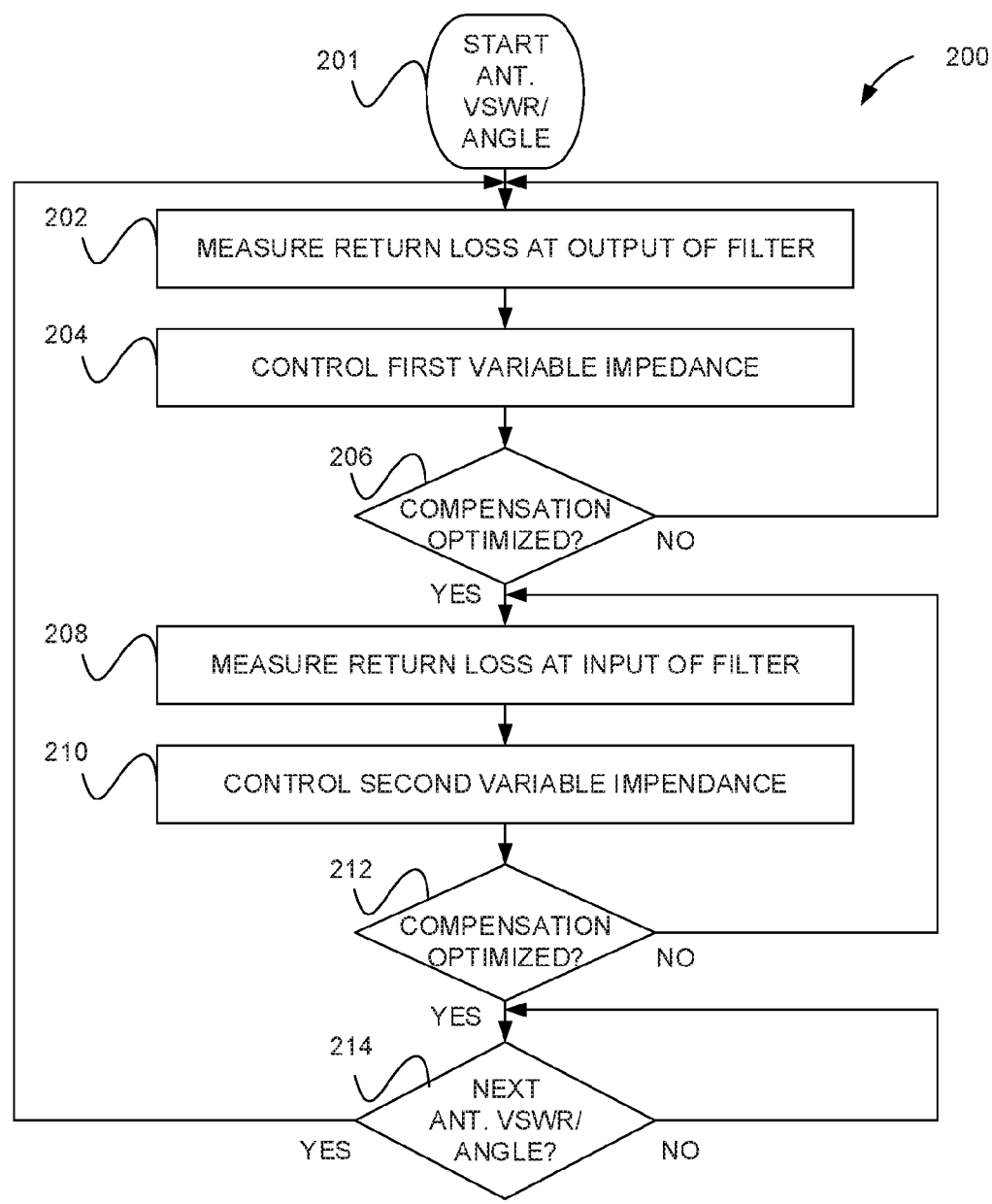
FIG. 2 illustrates a method for operating a transmitter equipped with dual variable impedance components, in accordance with one embodiment.

FIG. 2 illustrates a method 200 for operating a transmitter equipped with dual variable impedance components, in accordance with one embodiment. As an option, the method 200 may be implemented in the context of any one or more of the embodiments set forth in any previous and/or subsequent figure(s) and/or description thereof. For example, in one possible embodiment, the method 200 may be implemented for controlling the first variable impedance component 108 and the second variable impedance component 106 of the RF transmitter 100 of FIG. 1. However, it is to be appreciated that the method 200 may be implemented in the context of any desired environment.

As shown, the method 200 performs a plurality of operations. Further, as indicated in operation 201, such operations may be initiated based on any change in apparatus operation/configuration that results in a change in VSWR (e.g. a change in antenna beaming angle between zero (0) and three-hundred and sixty (360) degrees, etc.). For a particular apparatus operation/configuration, the method 200 proceeds by measuring a first return loss at an output of a filter (e.g. the output 110 of the filter 104 of FIG. 1, etc.). See operation 202.

Based on such first return loss, a first variable impedance of a first variable impedance component (e.g. the first variable impedance component 108 of FIG. 1, etc.) is controlled per operation 204. In one embodiment, such control of operation 204 may be such that the first variable impedance of the first variable impedance component is set to fully or substantially compensate for the first return loss (such that the first return loss is optimized). To the extent that the aforementioned return loss compensation is not optimal (based on a desired threshold or some other parameter, etc.), the operations 202-204 may be repeated per decision 206. As will be set forth during the description of later exemplary embodiments (e.g. shown in FIG. 5), such return loss may be detected using amplifier detectors, and the first variable impedance of the first variable impedance component may be controlled using a microprocessor (e.g. equipped with a look table, etc.) so that the variable impedance, to the extent possible, matches an antenna impedance to the filter impedance at an output of the filter.

To the extent that the aforementioned compensation is indeed optimal, the method 200 continues by measuring a second return loss at an input of a filter (e.g. the input 112 of the filter 104 of FIG. 1, etc.), in a manner similar to that set forth above in connection with the first variable impedance of the first variable impedance component. See operation 208. Based on such second return loss, a second variable impedance of a second variable impedance component (e.g. the second variable impedance component 106 of FIG. 1, etc.) is controlled, per operation 210. Similar to operation 204, the control of operation 204 may be such that the second variable impedance of the second variable impedance component is set to fully or substantially compensate for the second return loss (such that the second return loss is optimized). To the extent that the aforementioned compensation is not optimal (based on a desired threshold or some other parameter, etc.), the operations 208-210 may be repeated per decision 212.

Further, per decision 214, the method 200 may be repeated for a next angle/VSWR. As mentioned earlier, the apparatus may be configured for repeating each of the measuring and the controlling operations and related decisions 202, 204, 206, 208, 210, 212 for each of a plurality of antenna beaming angles between zero (0) and three-hundred and sixty (360) degrees. For example, in the context of a system with beam steering capabilities, the operations 202, 204, 208, 210 may be repeated each time one or more antennas of the system changes an angle at which a RF beam is directed. As a further option, the decision 214 may be repeated based on any other change in apparatus operation/configuration that results in a change in VSWR. Further, in still another embodiment, the foregoing repetition may be a function of a specific predetermined static or dynamic period.

Figure 3:
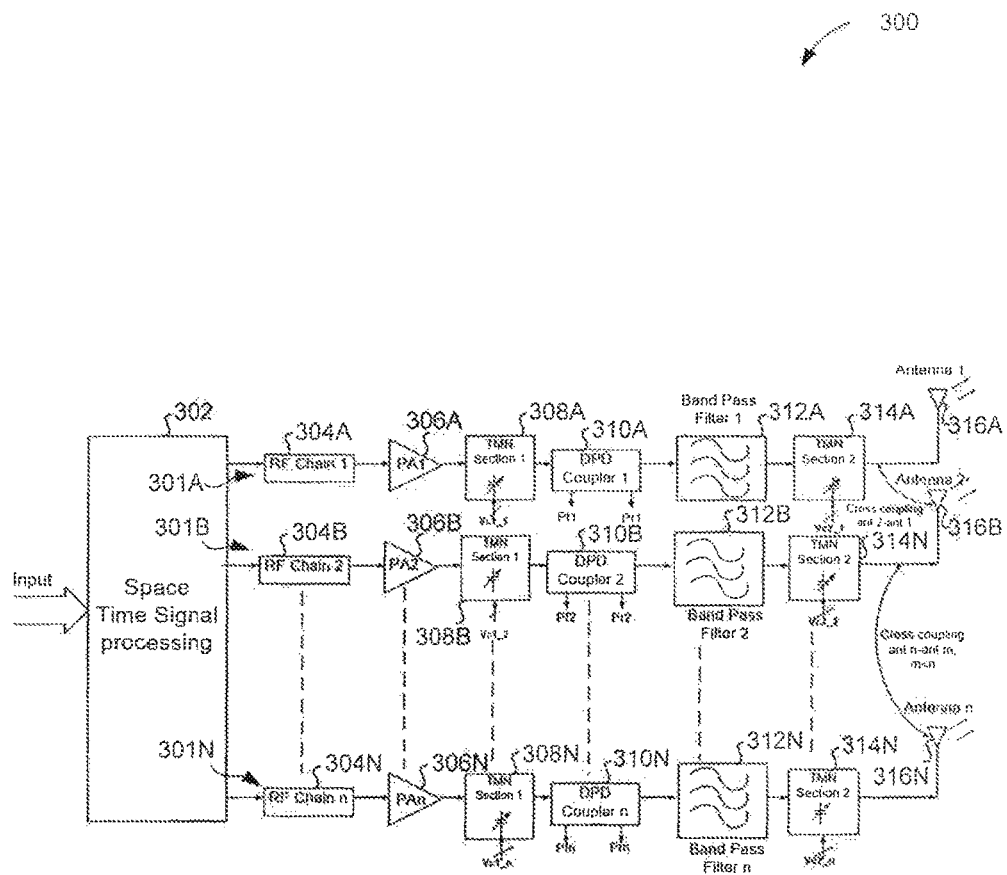
FIG. 3 illustrates a system with a RF transmitter equipped with dual variable impedance components, in accordance with another embodiment.

FIG. 3 illustrates a system 300 with a RF transmitter equipped with dual variable impedance components, in accordance with another embodiment. As an option, the system 300 may be implemented in the context of any one or more of the embodiments set forth in any previous and/or subsequent figure(s) and/or description thereof. For example, in one possible embodiment, the system 300 may be implemented with one or more of the features of the RF transmitter 100 of FIG. 1 and/or under the control of the method 200 of FIG. 2. However, it is to be appreciated that the method 200 may be implemented in the context of any desired environment.

As shown, the system 300 includes a plurality of transmitter paths 301A, 301B, 301N that are fed by a space/time signal processing module 302 which controls signal processing in a MIMO environment. Specifically, the space/time signal processing module 302 may be configured for addressing the fact that a RF channel may be affected by fading which, in turn, affects a signal to noise ratio (SNR) that impacts an error rate. To address this, the module 302 leverages the principle of diversity that provides a receiver with multiple versions of the same signal, which helps to stabilize a link and improves performance, thereby reducing the error rates.

The system 300 thus employs spatial diversity (e.g. antennas located in different positions, etc.) to take advantage of different radio paths that exist in a terrestrial environment. Specifically, the module 302 employs space-time signal processing in which time is complemented with a spatial dimension available during use of multiple spatially distributed antennas (i.e. the use of multiple antennas located at different points, etc.). As a result of the use of such multiple antennas, the module 302 leverages MIMO wireless technology and is able to considerably increase a capacity of a given channel. Further, by increasing a number of receive and transmit antennas, it is possible to linearly increase a throughput of the channel with every pair of antennas added to the system 300. In various embodiments, the system 300 is contemplated to be configured with 4×4, 16×16 and 64×64 MIMO configurations.

With continuing reference to FIG. 3, each of the transmitter paths 301A, 301B, 302N includes an RF chain 304A, 304B, 304N that prepares individual signals (received from the module 302) via pre-processing, for input to individual power amplifiers 306A, 306B, 306N that serve to amplify such individual pre-processed signals. The individual power amplifiers 306A, 306B, 306N, in turn, feed first tunable matching networks 308A, 308B, 308N that serve to control a return loss that is exhibited at an input of subsequent band pass filters 312A, 312B, 312N.

In use, this is accomplished utilizing digital pre-distortion (DPD) components 310A, 310B, 318N that are in electrical communication between the first tunable matching networks 308A, 308B, 308N and the band pass filters 312A, 312B, 312N. Specifically, the DPD components 310A, 310B, 318N measure a forward power Pf and a reflected power Pr, and further perform DPD linearization for the power amplifiers 306A, 306B, 306N. In the present description, the forward power Pf is a power of a transmission signal directed from the power amplifiers 306A, 306B, 306N toward a plurality of antennas 316A, 316B, 316N, while the reflected power Pr is a power of a reflected signal (resulting from the foregoing transmission signal) but directed in an opposite direction (e.g. from the antennas 316A, 316B, 316N toward the power amplifiers 306A, 306B, 306N.

Further, the first tunable matching networks 308A, 308B, 308N are configured for exhibiting variable impedance, based on the measured forward power Pf and reflected power Pr. In one embodiment, this variable impedance may be afforded by receiving a direct current control voltage Vc1, that is a function of the measured forward power Pf and reflected power Pr, for controlling the variable impedance. One exemplary circuit that may be used for controlling the control voltage Vc1 as a function of the measured forward power Pf and reflected power Pr will be set forth during reference to FIG. 5.

With continuing reference to FIG. 3, the transmitter paths 301A, 301B, 302N further include second tunable matching networks 314A, 314B, 314N that each serve to control a return loss that is exhibited at an output of the respective band pass filters 312A, 312B, 312N. Similar to the first tunable matching networks 308A, 308B, 308N, this is accomplished utilizing the DPD components 310A, 310B, 310N, which measure a forward power Pf and a reflected power Pr. Specifically, the second tunable matching networks 314A, 314B, 314N are configured for exhibiting variable impedance, based on the measured forward power PT and reflected power Pr. In one embodiment, this may be accomplished by receiving a direct current control voltage Vc2, that is a function of the measured forward power Pf and reflected power Pr, for controlling the variable impedance. Again, one exemplary circuit that may be used for controlling the control voltage Vc2 as a function of the measured forward power Pf and reflected power Pr will be set forth during reference to FIG. 5.

In use, the band pass filters 312A, 312B, 312N are designed to have a very steep roll off outside a transmit band. In various embodiments, this may be accomplished using FBAR filters, whose VSWR can be 2:1 (in a worst case, resulting in a return loss of −9.5 dB) in band. In addition, a cross coupling between the antennas 316A, 316B, 316N can produce an antenna VSWR of 2.5:1 (i.e. return loss of −7.4 dB in a worst case). Thus, a worst case cascaded VSWR of each of the band pass filters 312A, 312B, 312N and the antennas 316A, 316B, 316N may be as high as 5:1 (i.e. resulting in a return loss of −3.5 dB). If isolators were to be used at an output of the power amplifiers 306A, 306B, 306N, 2.6 dB of the transmitted power would be lost due to a mismatch between each isolator output, and a cascaded return loss of 3.5 dB would be presented at an input of the band pass filters 312A, 312B, 312N. However, by employing the first tunable matching networks 308A, 308B, 308N and the second tunable matching networks 314A, 314B, 314N (as opposed to such isolators) less (if any) transmitted power is lost due to an impedance mismatch in connection with the band pass filters 312A, 312B, 312N and the antennas 316A, 316B, 316N.

In addition, the use of FBAR filters in connection with the band pass filters 312A, 312B, 312N may also exhibit a group delay that is considerably large. If the band pass filters 312A, 312B, 312N were to be connected directly to the antennas 316A, 316B, 316N, the transmitted signal would be delayed by such group delay of the band pass filters 312A, 312B, 312N before reaching the antennas 316A, 316B, 316N. Further, the reflected signal from the antennas 316A, 316B, 316N would also be delayed again by the band pass filters 312A, 312B, 312N. Thus, a total signal delay would become double the group delay of the band pass filters 312A, 312B, 312N. For example, with a filter group delay of 15 ns, the total signal delay can be 30 ns, which translates into 33 MHz in frequency. Many frequency bands currently in use have bandwidths exceeding 33 MHz, which means that, at every 33 MHz in the transmit band, there would be a spike in the VSWR looking into the band pass filters 312A, 312B, 312N. Thus, similar to the compensation of the VSWR, the use of the first and second tunable matching networks 308A, 308B, 308N, 314A, 314B, 314N may be used to compensate for spikes in VSWRs caused by a delay in the band pass filters 312A, 312B, 312N.

Figure 4:
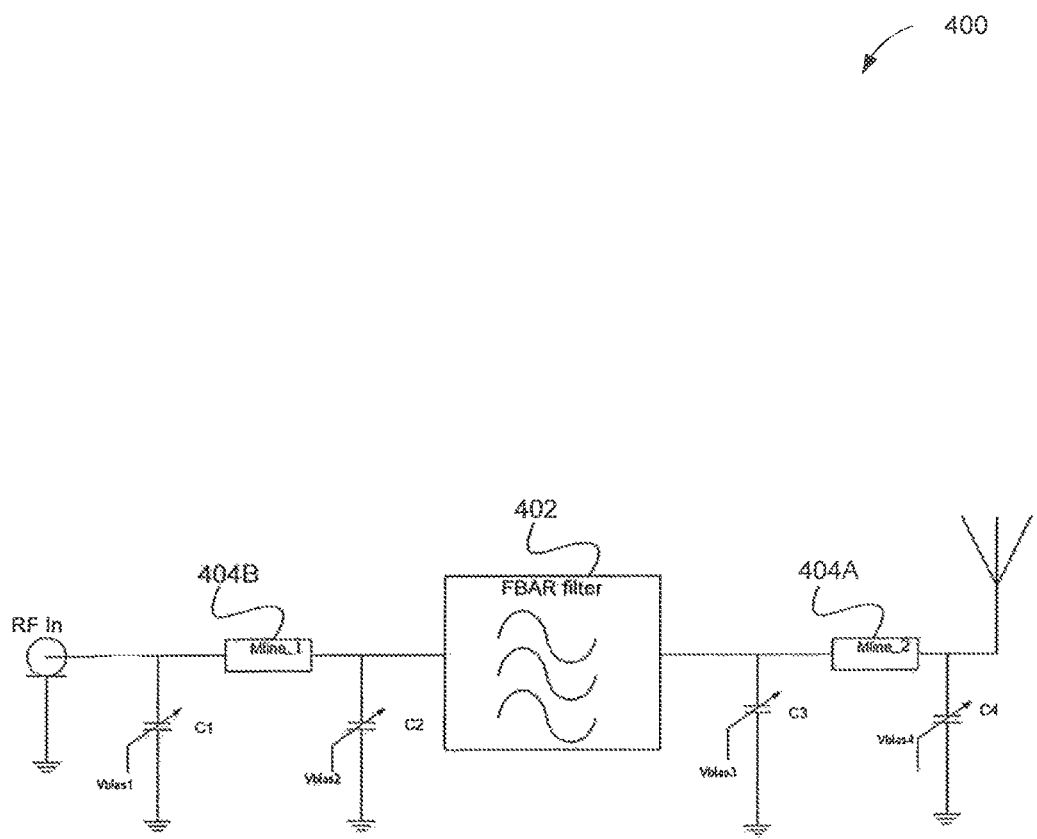
FIG. 4 illustrates an exemplary tunable matching network system, in accordance with another embodiment.

FIG. 4 illustrates an exemplary tunable matching network system 400, in accordance with another embodiment. As an option, the tunable matching network system 400 may be implemented in the context of any one or more of the embodiments set forth in any previous and/or subsequent figure(s) and/or description thereof. For example, the tunable matching network system 400 may be implemented in the context of the first and second tunable matching networks 308A, 308B, 308N, 314A, 314B, 314N of FIG. 3 or any of the impedance circuits referenced herein in this specification. However, it is to be appreciated that the tunable matching network system 400 may be implemented in the context of any desired environment.

As shown, the tunable matching network system 400 includes a first tunable matching network 404A and a second tunable matching network 404B that flank a filter 402 (e.g. the band pass filters 312A, 312B, 312N of FIG. 3, etc.). Further, each of the tunable matching networks 404A, 404B includes a micro strip line element Mline_1, Mline_2 and a pair of variable capacitive components (e.g. variable capacitors C1, C2, C3, C4, etc.).

In various embodiments, the variable capacitive components may take any form. For example, in an embodiment involving mechanically-controlled variable capacitive components, a distance between plates, or an amount of plate surface area which overlaps, may be changed. In another embodiment, digitally tuned variable capacitive components may employ integrated circuit (IC)-based variable capacitors that are manufactured using based on any desired technology (e.g. microelectromechanical systems (MEMS) technology, etc.). In yet another embodiment involving electrically-controlled variable capacitive components which will be further elaborated upon below, a thickness of a depletion layer of a reverse-biased semiconductor diode may be varied with a direct current voltage applied across the diode.

While the micro strip line element Mline_1, Mline_2 may be constructed in any desired form (e.g. standard, embedded, etc.), one form may include a flat conductor suspended over a ground plane, with a dielectric therebetween. At the time of manufacture, the impedance of the micro strip line element Mline_1, Mline_2 may be set by configuring various physical parameters thereof (e.g. thickness, height, width, etc.). Since the impedance of the micro strip line element Mline_1, Mline_2 is fixed after manufacture and any variability of the overall impedance of the tunable matching networks 404A, 404B results from varying the variable capacitive components, such micro strip line impedance may be set such that the variable range of the variable capacitive components, when taking the fixed micro strip line impedance into consideration, is sufficient to provide a desired range of impedance variability during use. In other embodiments, to the extent that the micro strip line element is capable of exhibiting dynamically-changing impedance (after manufacturer), use of the aforementioned capacitors avoided.

By this design, the tunable matching networks 404A, 404B may be configured for exhibiting different impedances. For example, this may be accomplished by applying a different control voltage V1, V2, V3, V4 in connection with the variable capacitors C1, C2, C3, C4. One exemplary circuit that may be used for controlling the control voltage V1, V2, V3, V4 will be set forth during reference to FIG. 5. As will become apparent, such the control voltage V1, V2, V3, V4 may be updated over time, for each of a plurality of antenna beaming angles between zero (0) and three-hundred and sixty (360) degrees during operation of an accompanying MIMO system (e.g. the MIMO system 300 of FIG. 3, etc.), and a plurality of antenna VSWRs of 1:1 to 2.5:1.

Thus, the tunable matching networks 404A, 404B employ the variable capacitors C1, C2, C3, C4 whose capacitance change as a function of a direct current (DC) voltage applied to them. The function of such variable capacitors C1, C2, C3, C4 is to tune the impedance of the transmitter paths between a power amplifier (e.g. the power amplifiers 306A, 306B, 306N of FIG. 3, etc.) and a filter (e.g. the band pass filters 312A, 312B, 312N of FIG. 3, etc.), as well as an antenna impedance so that a cascaded VSWR is minimized. It should be noted that, in other embodiments, the tunable matching networks 404A, 404B may employ other components and/or designs. For example, one embodiment is contemplated where a single element/component is utilized for such purpose (thus avoiding the need for an entire network of components and possibly avoiding use of capacitors, etc.).

In use of the tunable matching networks 404A, 404B, the values of the variable capacitors C3, C4 of the first tunable matching network 404A may be changed by changing the DC voltage V3, V4 applied to each of such variable capacitors C3, C4. The function of such variable capacitance of the variable capacitors C3, C4 of the first tunable matching network 404A is to match an antenna impedance to the filter impedance at an output of the filter 402. Similarly, the values of the variable capacitors C1, C2 of the second tunable matching network 404B may be changed by changing the DC voltage V1, V2 applied to each of such variable capacitors C1, C2. In contrast, however, the function of such variable capacitance of the variable capacitors C1, C2 of the second tunable matching network 404B is to match cascaded VSWRs of the transmit filter 402, the first tunable matching network 404A, and an antenna, to a predetermined value (e.g. 40 ohms, etc.).

Thus, regardless as to a value of an antenna VSWR, an effect of the two tunable matching networks 404A, 404B is to match a cascaded transmit path overall VSWR to the predetermined value (e.g. 50 ohms, etc.), so no transmitted power is lost (even for bad antenna and filter VSWRs). This is because the first tunable matching network 404A matches an output of the filter 402 to the antenna, regardless of an antenna VSWR. Therefore, any reflected signal from an input of the first tunable matching network 404A traveling back through the transmit filter 402 is very small in magnitude, and no transmit power is wasted. Furthermore, the second tunable matching network 404B matches an input of the transmit filter 402 to the predetermined value (e.g. 50 ohms, etc.), so no transmit power is lost due to an input VSWR of the transmit filter 402 (which can be as bad as 2:1 in some cases).

Figure 5:
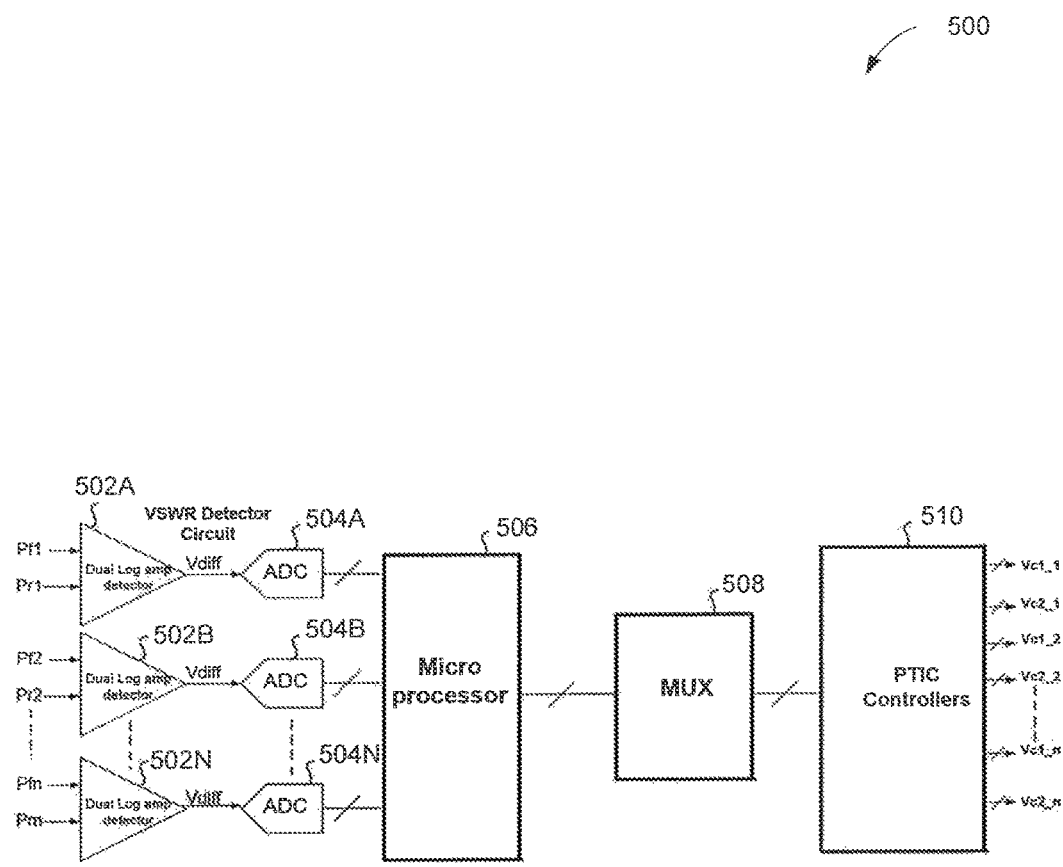
FIG. 5 illustrates a controller for controlling variable impedances of tunable matching networks, in accordance with one possible embodiment.

FIG. 5 illustrates a controller 500 for controlling variable impedances of tunable matching networks, in accordance with one possible embodiment. As an option, the controller 500 may be implemented in the context of any one or more of the embodiments set forth in any previous and/or subsequent figure(s) and/or description thereof. For example, the controller 500 may be used to control the variable capacitance values of the systems 300, 400 of FIGS. 3/4. However, it is to be appreciated that the controller 500 may be implemented in the context of any desired environment.

As shown, the controller 500 includes a plurality of dual log amplifier detectors 502A, 502B, 502N that each receive a forward power Pf and a reflected power Pr from a respective DPD component (e.g. DPD components 310A, 310B, 318N of FIG. 3, etc.) of an associated transmitter path of a MIMO system (e.g. transmitter paths 301A, 301B, 302N of the system 300 of FIG. 3, etc.). In use, the dual log amplifier detectors 502A, 502B, 502N each detect and output a difference between levels of the respective forward power Pf and the reflected power Pr that are received.

Such difference signals are then digitized via a plurality of analog to digital converters (ADCs) 504A, 504B, 504N and sent to a microprocessor 506. The microprocessor 506 is programmed to minimize this difference by driving a passive tuned integrated circuit (PTIC) controller 510 via a multiplexer 508. Specifically, in one embodiment, the microprocessor 506 may include a look-up table for outputting particular code words in response to specific difference signals, where such code words may be directed, via the multiplexer 508, to particular inputs of PTIC controller 510 such that specific variable capacitors of a corresponding transmitter path are set to particular control voltages/capacitances, in order to compensate for the particular difference signal.

Figure 6:
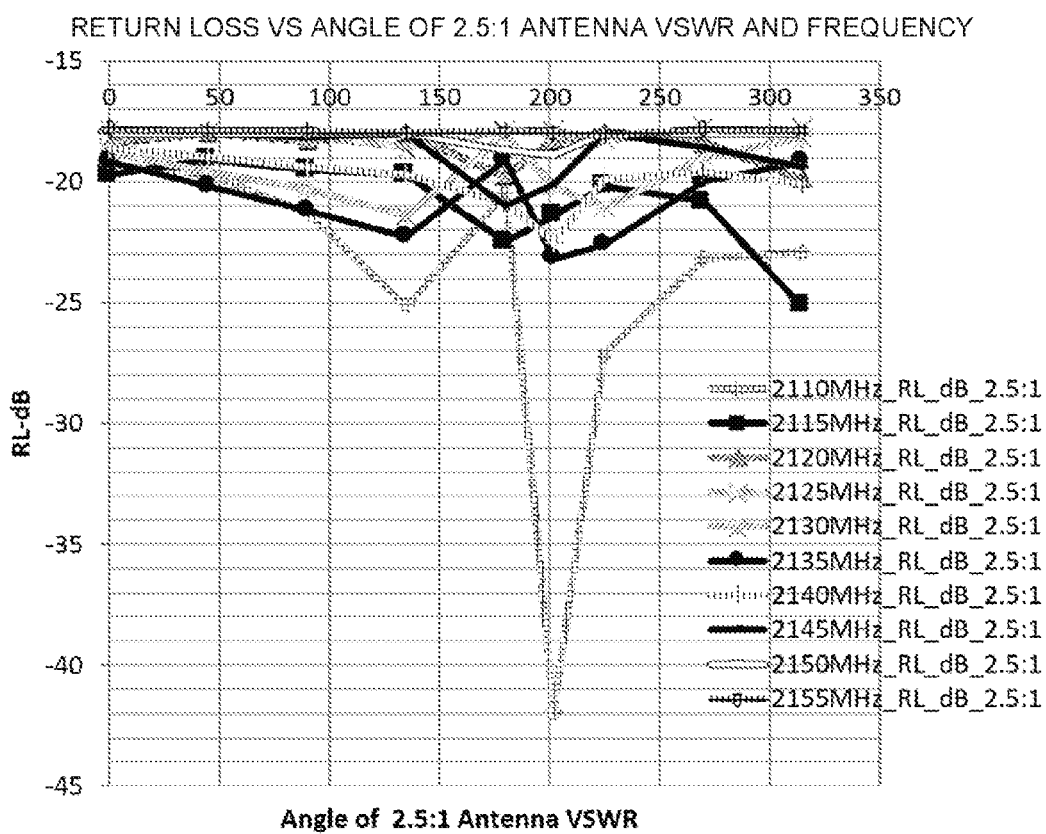
FIG. 6 illustrates a plot showing a return loss versus frequency, in accordance with one embodiment.

FIG. 6 illustrates a plot 600 showing a return loss versus frequency, in accordance with one embodiment. Specifically, such plot 600 shows a return loss versus frequency looking into an input of a particular tunable matching network (e.g. the first tunable matching networks 308A, 308B, 308N of FIG. 3, etc.—or the power amplifier RF load) for a case where an antenna VSWR is 2.5:1 and a band pass filter is an FBAR filter designed to operate in a 2.11-2.155 GHz band (worst case, VSWR=2:1). As shown, the antenna VSWR is kept constant at 2.5:1 while being rotated 360 degrees in 45 degree increments.

As shown, the return loss is better than 18 dB for all frequencies and antenna VSWR angles. One potential advantage of using the aforementioned tunable matching networks is that a power delivered to the antenna is not necessarily degraded even when the antenna VSWR is 2.5:1. This means that a coverage area is not reduced as the antenna VSWR degrades. As mentioned previously, there is cross coupling between antennas which degrades the antenna VSWR, in a MIMO system. Thus, the tunable matching networks may be particularly valuable in MIMO systems.

Figure 7:
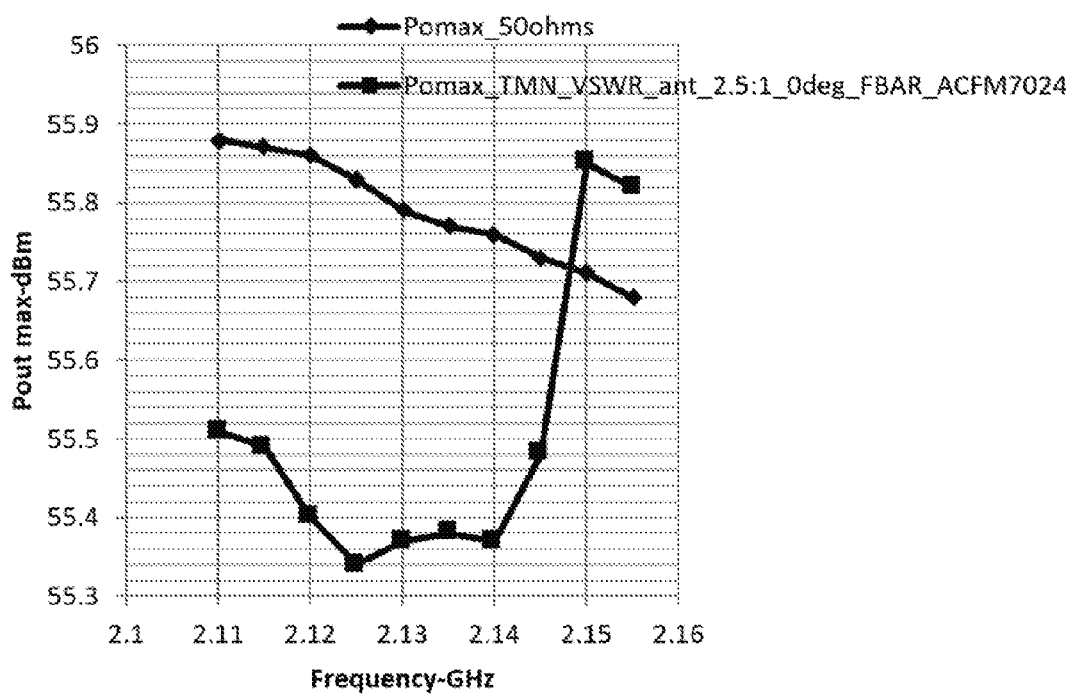
FIG. 7 shows a plot of a Doherty amplifier maximum output power versus frequency for a 50 ohm load case and a case where the tunable matching network is tuned to maximize a return loss presented to the amplifier.
Figure 8:
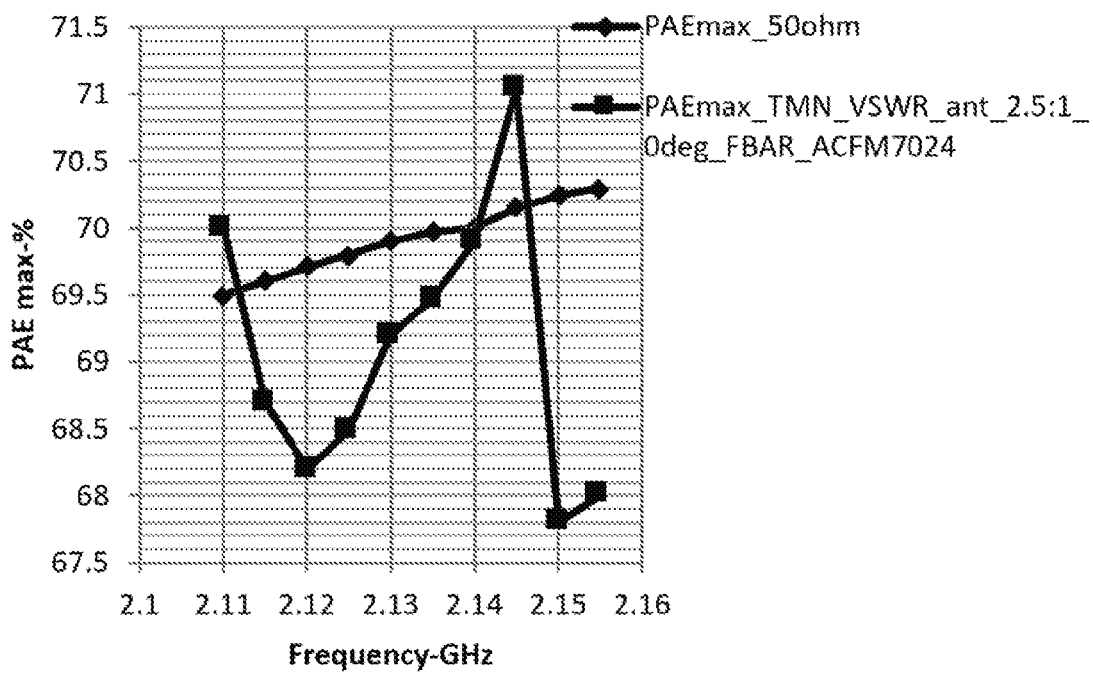
FIG. 8 is a plot showing a Doherty amplifier maximum power-added efficiency (PAE) versus frequency for a 50 ohm load case and a case where a tunable matching network (TMN) is tuned to maximize a return loss presented to the amplifier.

FIGS. 7 and 8 show exemplary simulation results for a Doherty amplifier operating with a tunable matching network topology shown in FIG. 3 for a case where the antenna VSWR=2.5:1 and a band pass filter is an FBAR filter. Specifically, FIG. 7 shows a plot 700 of a Doherty amplifier maximum output power versus frequency for a 50 ohm load case and a case where the tunable matching network is tuned to maximize a return loss presented to the amplifier. Further, FIG. 8 is a plot 800 showing a Doherty amplifier maximum power-added efficiency (PAE) versus frequency for a 50 ohm load case and a case where the TMN is tuned to maximize a return loss presented to the amplifier. Power amplifiers use high efficiency topologies such as Doherty and out phasing. These topologies use non-isolated output combiners to maximize efficiency, and thus these combiners are sensitive to the VSWR of the RF load presented to the amplifier, making various embodiments disclosed herein particularly useful.

Thus, the use of a dual tunable matching network, as described herein, potentially eliminates a need for an isolator, and minimizes a mismatch loss even for cases where the cascaded VSWR of the transmit filter and antenna is up to 5:1. This, in turn, maximizes an available power at the antenna, since an insertion loss of the tunable matching network for this condition is very small (e.g. 0.2 dB). Further, it should be noted that more (e.g. maximum) antenna power, in turn, translates into more (e.g. maximum) coverage area. For example, a 3 dB loss in transmitted power translates into a 12% reduction in the antenna coverage area.

Figure 9:
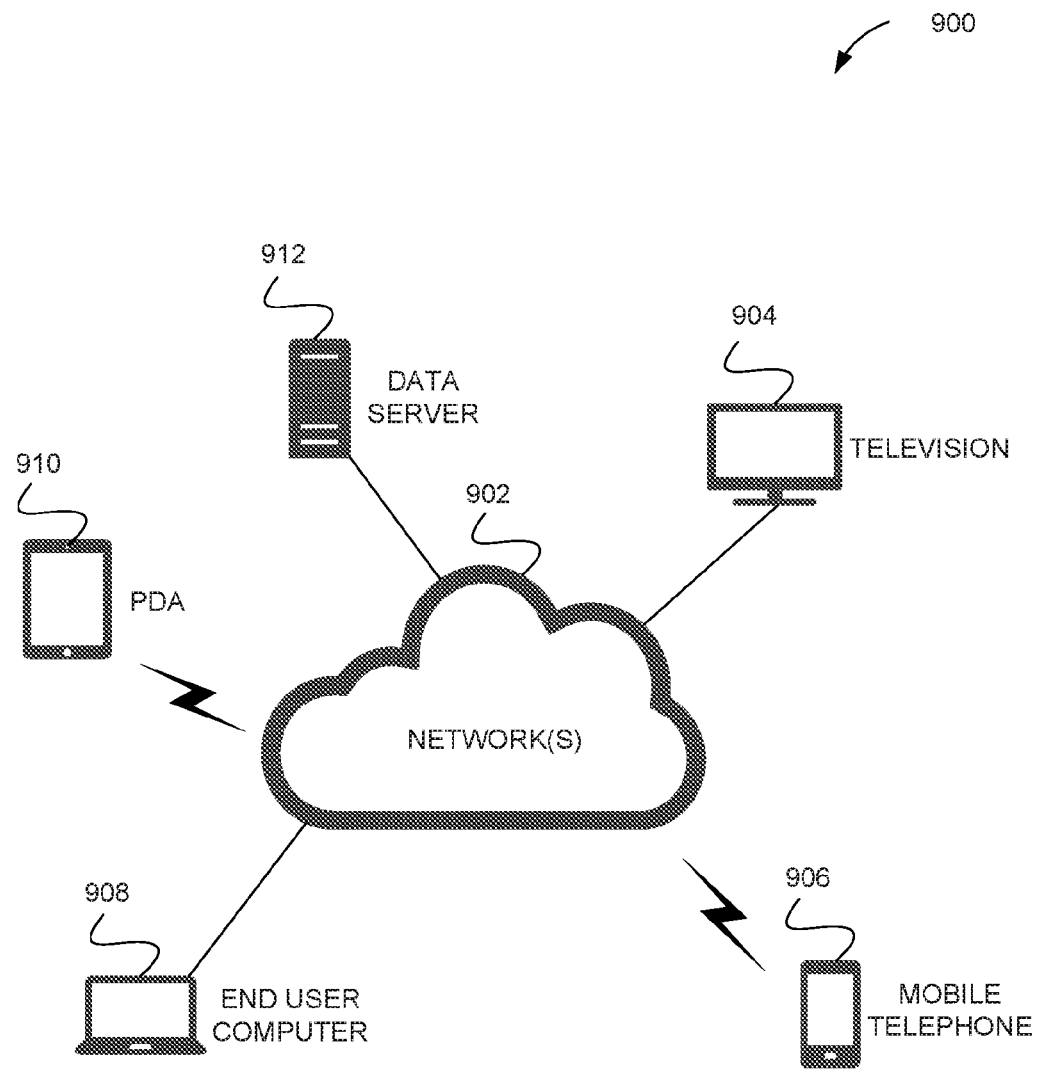
FIG. 9 illustrates a network architecture, in accordance with one embodiment.

FIG. 9 illustrates a network architecture 900, in accordance with one embodiment. As shown, at least one network 902 is provided. In various embodiments, any one or more features of the any of the embodiments described in previous figures may be implemented in the context of any of the components of the at least one network 902.

In the context of the present network architecture 900, the network 902 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 902 may be provided.

Coupled to the network 902 is a plurality of devices. For example, a server computer 912 and an end user computer 908 may be coupled to the network 902 for communication purposes. Such end user computer 908 may include a desktop computer, lap-top computer, and/or any other type of logic. Still yet, various other devices may be coupled to the network 902 including a personal digital assistant (PDA) device 910, a mobile phone device 906, a television 904, etc.

Figure 10:
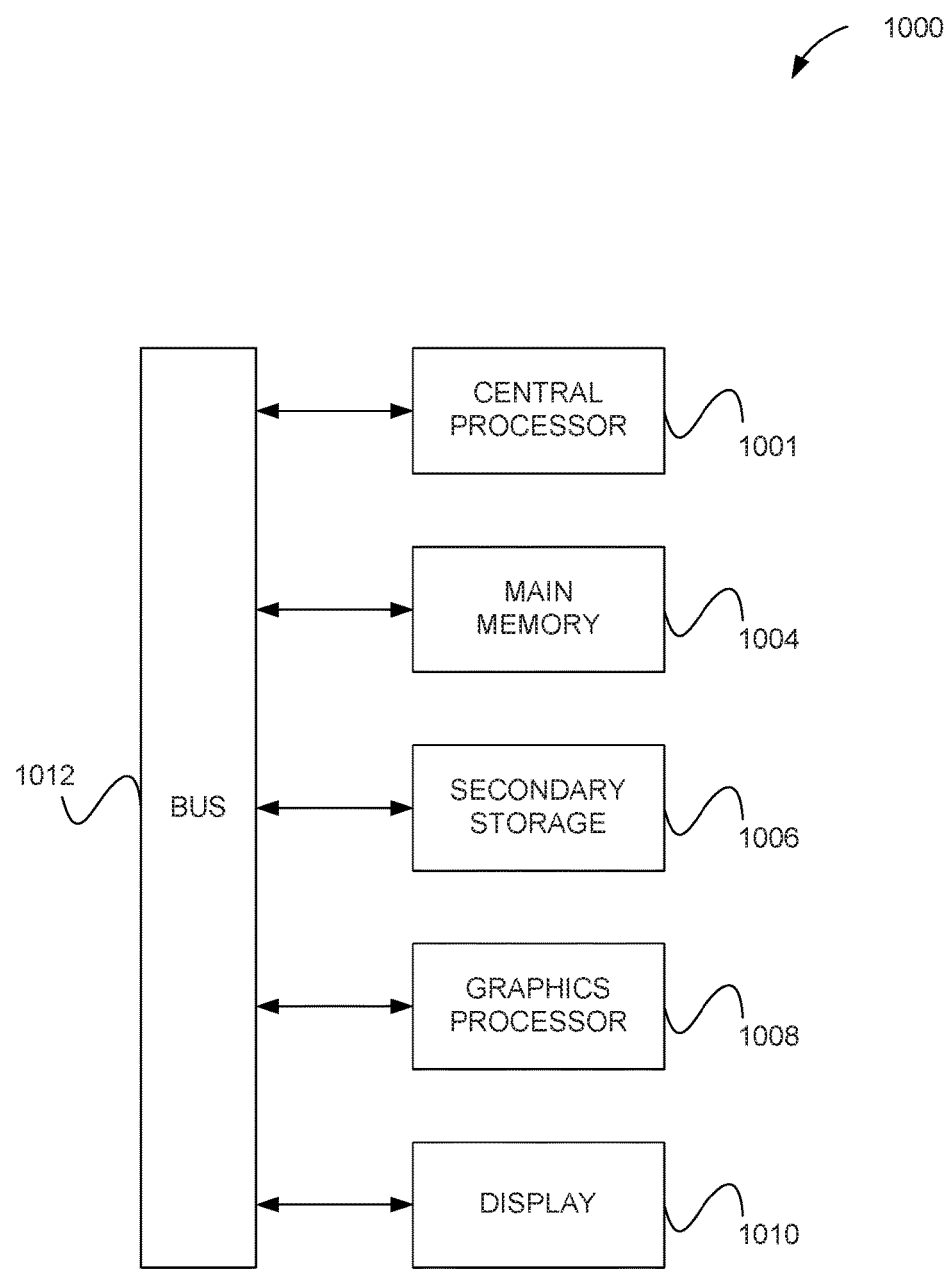
FIG. 10 illustrates an exemplary system, in accordance with one embodiment.

FIG. 10 illustrates an exemplary system 1000, in accordance with one embodiment. As an option, the system 1000 may be implemented in the context of any of the devices of the network architecture 900 of FIG. 9. However, it is to be appreciated that the system 1000 may be implemented in any desired environment.

As shown, a system 1000 is provided including at least one central processor 1002 which is connected to a bus 1012. The system 1000 also includes main memory 1004 [e.g., hard disk drive, solid state drive, random access memory (RAM), etc.]. The system 1000 also includes a graphics processor 1008 and a display 1010.

The system 1000 may also include a secondary storage 1006. The secondary storage 1006 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 1004, the secondary storage 1006, and/or any other memory, for that matter. Such computer programs, when executed, enable the system 1000 to perform various functions (as set forth above, for example). Memory 1004, secondary storage 1006 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory), optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
    at least one radio frequency (RF) transmitter including:
        a power amplifier configured to power amplify a signal;
        a filter configured to remove a component of the signal;
        an antenna port coupled to at least one antenna;
        a first variable impedance component in electrical communication between the filter and the antenna port to receive an output of the filter and to provide an input to the antenna port, wherein the first variable impedance component is configured to have a tunable impedance that is tunable during operation based on a first return loss at the filter; and
        a second variable impedance component in electrical communication between the power amplifier and the filter to receive an output of the power amplifier and to provide an input to the filter, wherein the second variable impedance component is configured to have a tunable impedance that is tunable during operation based on a second return loss at the filter; and
    wherein impedance of the first variable impedance component and impedance of the second variable impedance component are tuned based on return losses at the filter such that the at least one RF transmitter has a voltage standing wave ratio (VSWR) that satisfies a predetermined VSWR requirement.

2. The apparatus of claim 1, wherein the filter includes a bandpass filter.

3. The apparatus of claim 1, wherein the filter includes a film bulk acoustic resonator (FBAR) filter.

4. The apparatus of claim 1, wherein at least one of the first variable impedance component or the second variable impedance component includes a tunable matching network.

5. The apparatus of claim 4, wherein the tunable matching network includes a micro strip line element and a pair of variable capacitive components.

6. The apparatus of claim 4, wherein the tunable matching network is configured for exhibiting different impedances, for each of a plurality of antenna beaming angles between zero (0) and three-hundred and sixty (360) degrees.

7. The apparatus of claim 1, wherein the at least one RF transmitter includes a plurality of RF transmitters that are part of a multiple-input-multiple-output (MIMO)-capable system.

8. The apparatus of claim 1, wherein the first variable impedance component and the second variable impedance component are configured to cooperate to compensate for the VSWR of up to five-to-one (5:1).

9. The apparatus of claim 1, wherein the first variable impedance component and the second variable impedance component are configured to cooperate to compensate for the VSWR of five-to-one (5:1), for each of a plurality of antenna beaming angles between zero (0) and three-hundred and sixty (360) degrees.

10. The apparatus of claim 1, wherein the first variable impedance component and the second variable impedance component are configured to cooperate to compensate for a delay of the filter of up to thirty (30) nanoseconds.

11. The apparatus of claim 1, wherein the first variable impedance component and the second variable impedance component are configured to cooperate to compensate for a delay of the filter of up to thirty (30) nanoseconds, for each of a plurality of antenna beaming angles between zero (0) and three-hundred and sixty (360) degrees.

12. The apparatus of claim 1, wherein the at least one RF transmitter further includes an additional component in electrical communication between the first variable impedance component and the filter, for measuring a forward power and a reflected power.

13. The apparatus of claim 12, wherein at least one of the first variable impedance component or the second variable impedance component is configured for exhibiting variable impedance, based on the measured forward power and the measured reflected power.

14. The apparatus of claim 1, wherein the apparatus is configured for measuring a first return loss at an output of the filter, and controlling a first variable impedance of the first variable impedance component, based on the first return loss.

15. The apparatus of claim 14, wherein the apparatus is configured for measuring a second return loss at an input of the filter, and controlling a second variable impedance of the second variable impedance component, based on the second return loss.

16. The apparatus of claim 15, wherein the apparatus is configured for measuring the second return loss at the input of the filter, and controlling the second variable impedance of the second variable impedance component, after measuring the first return loss at the output of the filter, and controlling the first variable impedance of the first variable impedance component.

17. The apparatus of claim 15, wherein the apparatus is configured for repeating each of the measuring and the controlling for each of a plurality of antenna beaming angles between zero (0) and three-hundred and sixty (360) degrees.

18. The apparatus of claim 1, wherein the first variable impedance component and the second variable impedance component are tunable during operation for compensating for impedance mismatch.

19. The apparatus of claim 1, wherein the first variable impedance component and the second variable impedance component are tunable during operation for compensating for impedance mismatch in connection with each of a plurality of coupled antennas.

20. A method, comprising:
controlling a first variable impedance component, the first variable impedance component being in electrical communication between a filter and an antenna port of at least one radio frequency (RF) transmitter to receive an output of the filter and to provide an input to the antenna port, wherein the first variable impedance component is configured to have a tunable impedance that is tunable during operation based on a first return loss at the filter; and
controlling a second variable impedance component, the second variable impedance component being in electrical communication between a power amplifier and the filter of the at least one RF transmitter to receive an output of the power amplifier and to provide an input to the filter, wherein the second variable impedance component is configured to have a tunable impedance that is tunable during operation based on a second return loss at the filter; and
wherein the power amplifier is configured to power amplify a signal;
wherein the filter is configured to remove a component of the signal; and
wherein impedance of the first variable impedance component and impedance of the second variable impedance component are controlled to be tuned based on return losses at the filter, such that the at least one RF transmitter has a voltage standing wave ratio (VSWR) that satisfies a predetermined VSWR requirement.

21. The method of claim 20, and further comprising measuring a first return loss at an output of the filter; and controlling a first variable impedance of the first variable impedance component, based on the first return loss.

22. The method of claim 21, and further comprising measuring a second return loss at an input of the filter; and controlling a second variable impedance of the second variable impedance component, based on the second return loss.

23. A radio frequency (RF) transmitter comprising:
a power amplifier that is configured to produce a power amplified output;
an antenna port coupled to at least one antenna;
a filter coupled to receive the power amplified output, the filter configured to produce a filtered power amplified output that has removed therefrom a component of the power amplified output;
a first variable impedance element coupled between the filter and the antenna port to receive an output of the filter and to provide an input to the antenna port, wherein the first variable impedance element is configured to have a tunable impedance that is tunable during operation based on a first return loss at the filter;
a second variable impedance element coupled between the power amplifier and the filter to receive an output of the power amplifier and to provide an input to the filter, wherein the second variable impedance element is configured to have a tunable impedance that is tunable during operation based on a second return loss at the filter; and circuitry configured to provide control signals to the first and second variable impedance elements to tune impedances of the first and second variable impedance elements based on return losses at the filter during operation such that the RF transmitter has a voltage standing wave ratio (VSWR) on a transmit path that meets a predetermined VSWR requirement.

24. The transmitter of claim 23, wherein the filter includes at least one of a bandpass filter and a film bulk acoustic resonator (FBAR) filter.

25. The transmitter of claim 23, further including a tunable matching network.

26. The transmitter of claim 25, wherein the tunable matching network includes a micro strip line element and a pair of variable capacitive components.

* * * * *